United States Patent
Hsieh et al.

(10) Patent No.: US 8,063,557 B2
(45) Date of Patent: Nov. 22, 2011

(54) LIGHT-EMITTING DEVICE HAVING WAVELENGTH-CONVERTING MATERIALS THEREWITHIN

(75) Inventors: Min-Hsun Hsieh, Hsinchu (TW); Ta-Cheng Hsu, Hsinchu (TW); Ya-Ju Lee, Hsinchu (TW); Wei-Chih Peng, Hsinchu (TW); Chi-Wei Lu, Hsinchu (TW); Ya-Lan Yang, Hsinchu (TW); Ying-Yong Su, Hsinchu (TW); Meng-Lnn Tsai, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 377 days.

(21) Appl. No.: 11/893,220

(22) Filed: Aug. 14, 2007

(65) Prior Publication Data

US 2007/0284999 A1 Dec. 13, 2007

Related U.S. Application Data

(63) Continuation-in-part of application No. 11/326,750, filed on Jan. 6, 2006, now Pat. No. 7,489,068, which is a continuation-in-part of application No. 11/160,588, filed on Jun. 29, 2005, now Pat. No. 7,928,455, which is a continuation-in-part of application No. 10/604,245, filed on Jul. 4, 2003, now Pat. No. 6,987,287.

(30) Foreign Application Priority Data

Jan. 25, 2005 (TW) ............................... 94102193 A

(51) Int. Cl.
*H01J 1/62* (2006.01)

(52) U.S. Cl. ...................................... 313/506; 313/116

(58) Field of Classification Search .................. 313/506, 313/113
See application file for complete search history.

(56) References Cited

U.S. PATENT DOCUMENTS

| | | | | |
|---|---|---|---|---|
| 6,442,184 B1 * | 8/2002 | Ota et al. | ............... | 372/43.01 |
| 6,635,363 B1 * | 10/2003 | Duclos et al. | ............... | 428/690 |
| 6,686,676 B2 * | 2/2004 | McNulty et al. | ............... | 313/112 |
| 6,747,406 B1 * | 6/2004 | Bortscheller et al. | ......... | 313/512 |
| 6,890,234 B2 * | 5/2005 | Bortscheller et al. | ........... | 445/25 |
| 7,018,859 B2 * | 3/2006 | Liao et al. | ............... | 438/22 |
| 7,129,527 B2 | 10/2006 | Yang | ............... | 257/98 |
| 2002/0017652 A1 | 2/2002 | Illek et al. | ............... | 257/95 |
| 2004/0012958 A1 * | 1/2004 | Hashimoto et al. | ........... | 362/241 |
| 2004/0061136 A1 | 4/2004 | Tyan et al. | ............... | 257/200 |
| 2004/0104393 A1 * | 6/2004 | Liu et al. | ............... | 257/79 |
| 2004/0104672 A1 * | 6/2004 | Shiang et al. | ............... | 313/506 |
| 2004/0212296 A1 * | 10/2004 | Nakamura et al. | ........... | 313/504 |
| 2005/0263776 A1 * | 12/2005 | Hsieh et al. | ............... | 257/79 |
| 2005/0287687 A1 * | 12/2005 | Liao et al. | ............... | 438/22 |
| 2006/0163595 A1 * | 7/2006 | Hsieh et al. | ............... | 257/95 |

FOREIGN PATENT DOCUMENTS

| | | |
|---|---|---|
| JP | 2000-183464 | 6/2000 |
| JP | 2004-235615 | 8/2004 |
| WO | 2007087954 | 8/2007 |

OTHER PUBLICATIONS

Chinese First Examination Report of China Application No. 2008101297486, dated Jun. 12, 2009.

(Continued)

*Primary Examiner* — Peter Macchiarolo
(74) *Attorney, Agent, or Firm* — J.C. Patents

(57) ABSTRACT

A light-emitting device comprising a substrate, a light-emitting stack, and a transparent adhesive layer having wavelength-converting materials embedded therein formed within the light-emitting device is provided.

26 Claims, 6 Drawing Sheets

OTHER PUBLICATIONS

Attachment 1: Shuji Nakamura et al., "The Blue Diode: 4 GaN Growth" p. 47, ISBN 3-540-66505-6 Springer-Verlag Berlin Heidelberg, New York, 2000 (Physics and astronomy).

Attachment 2: William M Yen et al., "Inorganic phosphors : compositions, preparation, and optical properties" The CRC Press, ISBN 0-8493-1949-8, pp. 60, 61, 182 and 183.

* cited by examiner

LIGHT-EMITTING DEVICE HAVING WAVELENGTH-CONVERTING MATERIALS THEREWITHIN

RELATED APPLICATION

This application is a continuation-in-part of U.S. patent application, Ser. No.11/326,750, entitled "LIGHT EMITTING DEVICE", filed on Jan. 6, 2006, the entire contents of which are incorporated herein by reference. Moreover, this application is also a continuation-in-part of U.S. patent application, Ser. No. 11/160,588, entitled "SEMICONDUCTOR LIGHT-EMITTING DEVICE AND METHOD FOR FORMING THE SAME", filed on Jun. 29, 2005, the entire contents of which are incorporated herein by reference. Furthermore, U.S. patent application Ser. No. 11/160,588 is a continuation-in-part of U.S. patent application, Ser. No. 10/604,245, entitled "LIGHT EMITTING DIODE HAVING AN ADHESIVE LAYER AND A REFLECTIVE LAYER AND MANUFACTURING METHOD THEREOF", filed on Jul. 4, 2003.

BACKGROUND OF THE INVENTION

1. Technical Field

The present invention relates to a light-emitting device and in particularly to a light-emitting device having a transparent adhesive layer embedded with wavelength-converting materials.

2. Description of the Related Art

Light-emitting devices have been employed in a wide variety of applications, including optical displays, traffic lights, data storage apparatus, communication devices, illumination apparatus, and medical treatment equipment. How to improve the light-emitting efficiency of light-emitting devices is an important issue in this art.

Referring to FIG. 1, according to Snell's law, when a light is directed from one material with an refractive index n1 towards another material with an refractive index n2, the light will be refracted if its incident angle is smaller than a critical angle $\theta_c$. Otherwise, the light will be totally reflected from the interface between the two materials. In other words, when a light beam generated from a light-emitting diode (LED) travels across an interface from a material of a higher refractive index to a material of a lower refractive index, the angle between the incident light beam and the reflected light beam must be equal or less than $2\theta_c$ for the light to be emitted out. It means that when the light generated from the LED travels from an epitaxial layer having a higher refractive index to a medium having a lower refractive index, such as a substrate, air and so on, a portion of the light will be refracted into the medium, and another portion of the light with an incident angle larger than the critical angle will be reflected back to the epitaxial layer of the LED. Owing to the environment surrounding the epitaxial layer of the LED having a lower refractive index, the reflected light is reflected back and forth for several times inside the LED and finally a certain portion of said reflected light is absorbed.

In U.S. Patent Publication No. 2002/0017652 entitled "Semiconductor Chip for Optoelectronics", an epitaxial layer of a light-emitting device forming on a non-transparent substrate is etched to form a micro-reflective structure having a multiplicity of semi-spheres, pyramids, or cones, then a metal reflective layer is deposited on the epitaxial layer. The top of the micro-reflective structure is bonded to a conductive carrier (silicon wafer), and then the non-transparent substrate of the epitaxial layer is removed. All the light generated from the light-emitting layer and incident to the micro-reflective structure will be reflected back to the epitaxial layer and emitted out of the LED with a direction perpendicular to a light-emitting surface. Therefore, the light will not be restricted by the critical angle any more.

SUMMARY OF THE INVENTION

Accordingly, the present invention provides a light-emitting device comprises a transparent adhesive layer having wavelength-converting materials embedded therein.

Another aspect of the present invention is to provide a light-emitting device comprising a substrate, a light-emitting stack, and a transparent adhesive layer having wavelength-converting materials embedded therein formed within the light-emitting device.

As embodied and broadly described herein, the light-emitting stack comprising a diffusing surface adjacent to the transparent adhesive layer. The transparent adhesive layer is disposed between the substrate and the diffusing surface of the light-emitting stack.

According to one embodiment of the present invention, the wavelength-converting materials comprises at least one selected from the group consisting of blue phosphor, yellow phosphor, green phosphor, and red phosphor.

According to one embodiment of the present invention, a material of the transparent substrate is selected from one of the group consisting of GaP, SiC, $Al_2O_3$ and glass.

According to one embodiment of the present invention, a material of the light-emitting stack is selected from one of the group consisting of AlGaInP, AlN, GaN, AlGaN, InGaN and AlInGaN.

According to one embodiment of the, present invention, a material of the transparent adhesive layer is selected from one of the group consisting of polyimide, benzocyclobutene (BCB), prefluorocyclobutane (PFCB) and indium tin oxide.

According to one embodiment of the present invention, the diffusing surface is a rough surface.

According to one embodiment of the present invention, the rough surface comprises a plurality of micro-protrusions. The shape of the micro-protrusions is selected from one of the group consisting of semi-sphere, pyramid, pyramid polygon, and the combinations thereof.

According to one embodiment of the present invention, the rough surface is a convex-concave surface.

According to one embodiment of the present invention, the light-emitting stack comprises a first semiconductor layer, a light-emitting layer and a second semiconductor layer. The first semiconductor layer is disposed above the substrate and has the diffusing surface. The light-emitting layer is disposed on a portion of the first semiconductor layer. The second semiconductor layer is disposed on the light-emitting layer.

According to one embodiment of the present invention, the second semiconductor layer has another diffusing surface. According to one embodiment of the present invention, the light-emitting device further comprises a first electrode and a second electrode. The first electrode is disposed on the first semiconductor layer where the light-emitting layer is not disposed thereon, and the second electrode is disposed on the second semiconductor layer.

According to one embodiment of the present invention, the light-emitting device further comprises a first transparent conductive layer disposed between the first electrode and the first semiconductor layer.

According to one embodiment of the present invention, a material of the first transparent conductive layer is selected from one of the group consisting of indium tin oxide, cadmium tin oxide, antimony tin oxide, zinc aluminium oxide and zinc tin oxide.

According to one embodiment of the present invention, the light-emitting device further comprises a first reaction layer and a second reaction layer. The first reaction layer is disposed between the substrate and the transparent adhesive layer, and the second reaction layer is disposed between the transparent adhesive layer and the light-emitting stack.

According to one embodiment of the present invention, the first reaction layer is conductive.

According to one embodiment of the present invention, the second reaction layer is conductive.

According to one embodiment of the present invention, a material of the first reaction layer is selected from one of the group consisting of SiNx, Ti and Cr.

According to one embodiment of the present invention, a material of the second reaction layer is selected from one of the group consisting of SiNx, Ti and Cr.

According to one embodiment of the present invention, the second reaction layer is in ohmic contact with the first reaction layer with the existence of the plurality of micro-protrusions penetrating through the transparent adhesive layer.

According to one embodiment of the present invention, the second reaction layer is in ohmic contact with the first reaction layer with the existence of the convex part of the convex-concave surface penetrating through the transparent adhesive layer.

According to one embodiment of the present invention, the light-emitting stack comprises a first semiconductor layer, a light-emitting layer and a second semiconductor layer. The first semiconductor layer is disposed above the substrate and has the diffusing surface. The light-emitting layer is disposed on the first semiconductor layer. The second semiconductor layer is disposed on the light-emitting layer.

According to one embodiment of the present invention, the transparent substrate is conductive.

According to one embodiment of the present invention, the transparent adhesive layer is a transparent conductive adhesive layer and a material of the transparent conductive adhesive layer is selected from one of the group consisting of intrinsically conductive polymer and polymer having conductive material distributed therein.

According to one embodiment of the present invention, the polymer is selected from one of the group consisting of polyimide, benzocyclobutene (BCB), and prefluorocyclobutane (PFCB).

According to one embodiment of the present invention, the conductive material is selected from one of the group consisting of indium tin oxide, cadmium tin oxide, antimony tin oxide, zinc oxide, zinc tin oxide, Au and Ni/Au.

According to one embodiment of the present invention, the light-emitting device further comprises a first electrode and a second electrode. The first electrode is disposed on the second semiconductor layer, and the second electrode is disposed under the transparent substrate.

According to one embodiment of the present invention, the light-emitting device further comprises a transparent conductive layer disposed between the second semiconductor layer and the first electrode.

According to one embodiment of the present invention, a material of the transparent conductive layer is selected from one of the group consisting of indium tin oxide, cadmium tin oxide, antimony tin oxide, zinc aluminium oxide and zinc tin oxide.

According to one embodiment of the present invention, the light-emitting stack and the transparent adhesive layer have different refractive indices, such that the possibility of light extraction of the light-emitting device is raised, and the light-emitting efficiency is improved, too.

BRIEF DESCRIPTION OF THE DRAWINGS

The accompanying drawings incorporated herein provide a further understanding of the invention therefore constitute a part of this specification. The drawings illustrating embodiments of the invention, together with the description, serve to explain the principles of the invention.

DETAILED DESCRIPTION OF THE EMBODIMENTS

Figure 1:
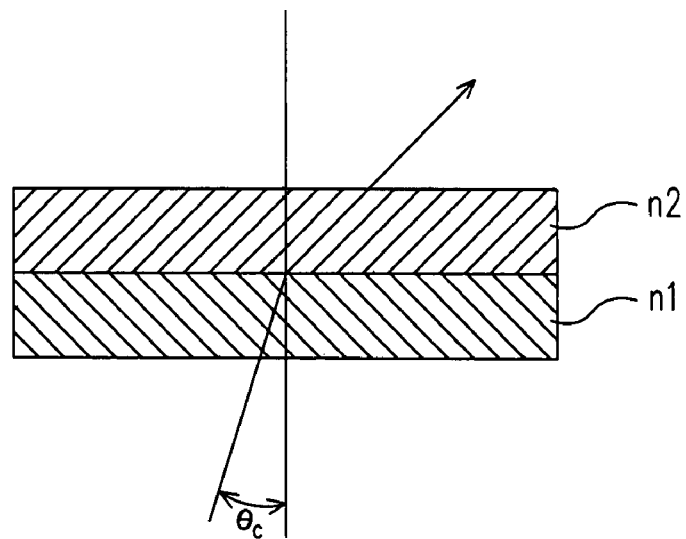
FIG. 1 is a schematic diagram illustrating the Snell's law.

Reference will now be made in detail to the present preferred embodiments of the invention, examples of which are illustrated in the accompanying drawings. Wherever possible, the same reference numbers are used in the drawings and the descriptions hereof refer to the same or like parts.

Figure 2:
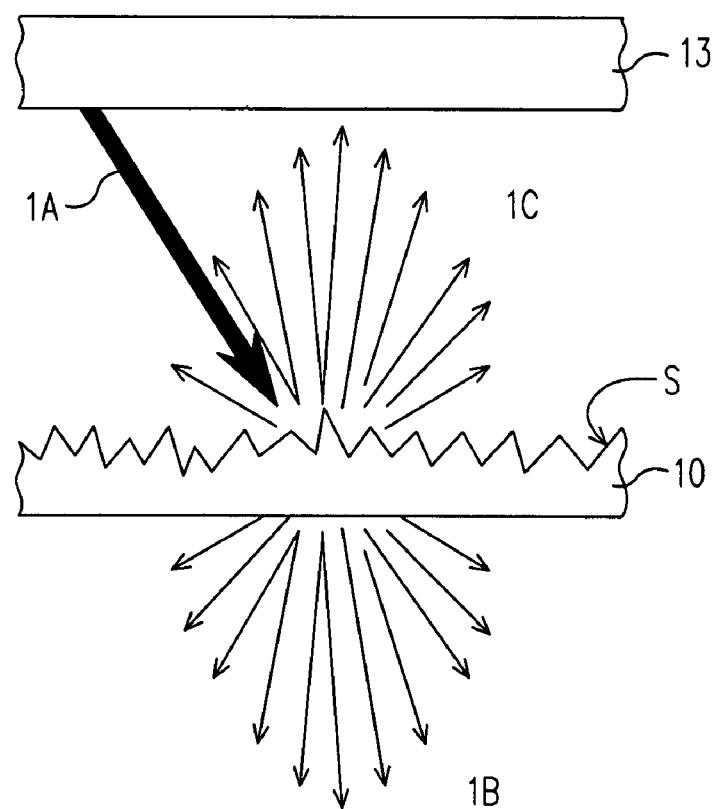
FIG. 2 is a schematic diagram showing a light field of the present invention.

FIG. 2 is a schematic diagram showing a light field of the present invention. Referring to FIG. 2, when a light IA generated from a light-emitting layer 13 is directed towards a diffusing surface S, a portion of the light 1A is refracted to a substrate 10 to form a light field 1B, and another portion of the light 1A is diffused by the diffusing surface S to form a light field 1C. The light, which is restricted to the critical angle, is diffused and redirected by the diffusing surface S to the light-emitting layer 13, and then is extracted from the front of the light-emitting layer 13, therefore the light extraction efficiency is enhanced. If a portion of the diffused light is totally reflected to the diffusing surface S owing to its incident angle greater than the critical angle, it will be diffused again to change its incident angle, thus improving the light extraction efficiency. Therefore, no matter how many times the light experiences the total internal reflection, the light will be diffused by the diffusing surface S to increase the probability of light extraction and enhance the light-emitting efficiency.

Figure 3:
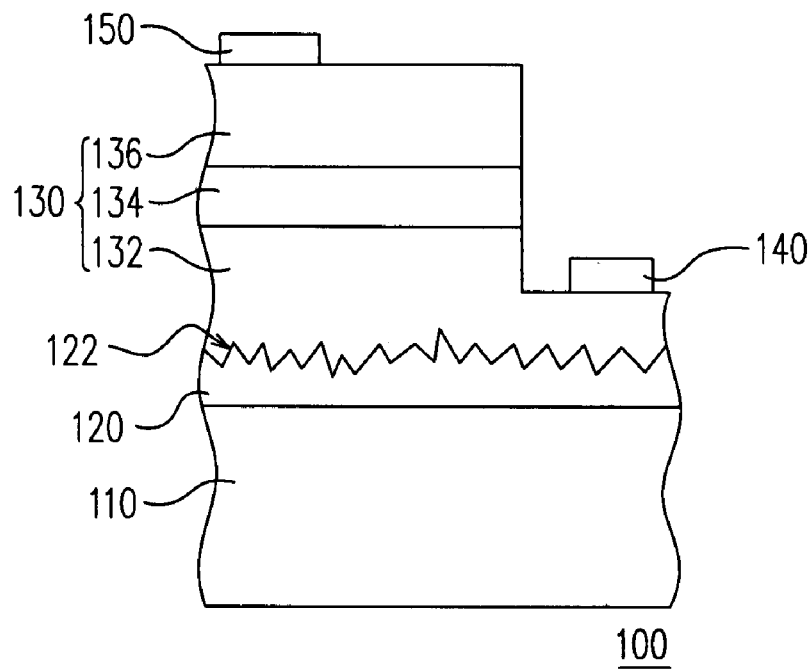
FIG. 3 is a schematic, cross-sectional view showing a light-emitting device according to a preferred embodiment of the present invention.
Figure 4:
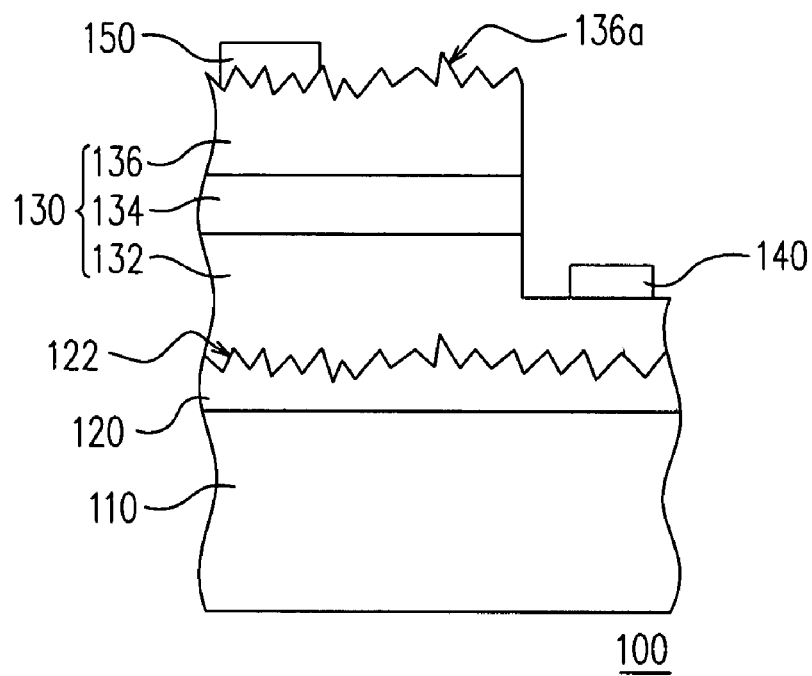
FIG. 4 is a schematic, cross-sectional view showing a light-emitting device having two diffusing surfaces according to a preferred embodiment of the present invention.

FIG. 3 is a schematic cross-sectional view showing a light-emitting device according to a preferred embodiment of the present invention. The light-emitting device 100 comprises a substrate 110, a transparent adhesive layer 120, a light-emitting stack 130, a first electrode 140, and a second electrode 150. In one embodiment of the present invention, the substrate is a transparent substrate and the material of the substrate 110 is selected from one of the group consisting of GaP, SiC, Al$_2$O$_3$ and glass. The transparent adhesive layer 120 is formed on the substrate 110, and the material of the transparent adhesive layer 120 can be polyimide, benzocyclobutene (BCB), prefluorocyclobutane (PFCB), or indium tin oxide. The light-emitting stack 130 comprises a first semiconductor layer 132, a light-emitting layer 134 and a second semiconductor layer 136. The refractive index of the light-emitting stack 130 is different from that of the transparent adhesive layer 120. The first semiconductor layer 132 attaches to the substrate 110 through the transparent adhesive layer 120, and has a first diffusing surface 122 next to the transparent adhesive layer 120. The material of the first semiconductor layer 132, the light-emitting layer 134 and the second semiconductor layer 136 can be AlGaInP, AlN, GaN, AlGaN, InGaN or AlInGaN. An upper surface of the first semiconductor layer 132 has an epitaxy region and an electrode region. The light-emitting layer 134 is formed on the epitaxy region of the first semiconductor layer 132. The second semiconductor layer 136 is formed on the light-emitting layer 134. The first electrode 140 is formed on the electrode region of the first semiconductor layer 132. The second electrode 150 is formed on the second semiconductor layer 136. Referring to FIG. 4, an upper surface of the second semiconductor layer 136 may further comprise a second diffusing surface 136a to increase the light extracted from the diffusing surface 136a. For further increasing the light extracted from the substrate, it is also preferred to form diffusing surfaces on either or both sides of the substrate as indicated in 110a and 110b of FIG. 10.

The way to form the first semiconductor layer 132, the light-emitting layer 134 and the second semiconductor layer 136 on the substrate 110 as shown in FIGS. 3 and 4 is to use an epitaxy method, such as MOVPE method (Metallic Organic Vapor Phase Epitaxy). The diffusing surfaces 122, 136a, 110a, and 110b can be rough surfaces formed during the exitaxy process by carefully tuning and controlling the process parameters, such as gas flow rate, chamber pressure, chamber temperature etc. The diffusing surfaces can also be formed by removing a part of the first semiconductor layer 132, the second semiconductor layer 136, or the substrate 110 by wet etching or dry etching to form a periodic, quasi-periodic, or random pattern.

In another embodiment of the present invention, the diffusing surface 122 of the first semiconductor layer 132 or the diffusing surfaces 110a, 110b of the substrate 110 comprises a plurality of micro-protrusions. The shape of the micro-protrusions can be a semi-sphere, a pyramid, or a pyramid polygon. The light extraction efficiency is therefore enhanced by the surface roughened in a manner of micro-protrusions.

Figure 5:
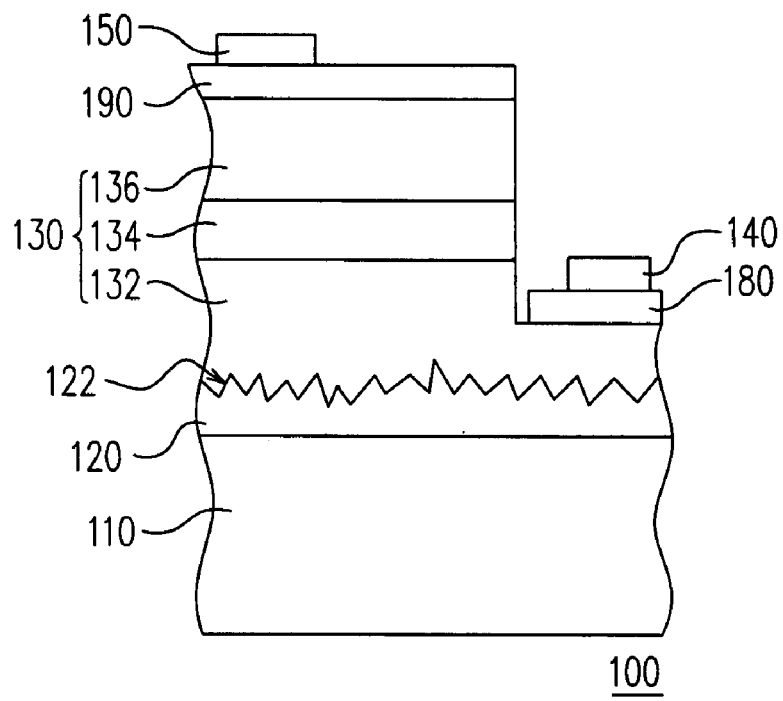
FIG. 5 is a schematic, cross-sectional view showing a light-emitting device having transparent conductive layers according to a preferred embodiment of the present invention.

In one embodiment of the present invention, referring to FIG. 5, a first transparent conductive layer 180 is selectively disposed between the first electrode 140 and the first semiconductor layer 132. The material of the first transparent conductive layer 180 comprises indium tin oxide, cadmium tin oxide, antimony tin oxide, zinc aluminium oxide, or zinc tin oxide. Similarly, a second transparent conductive layer 190 is selectively disposed between the second semiconductor layer 136 and the second electrode 150. The material of the second transparent conductive layer 190 comprises indium tin oxide, cadmium tin oxide, antimony tin oxide, zinc aluminium oxide, or zinc tin oxide.

Figure 6:
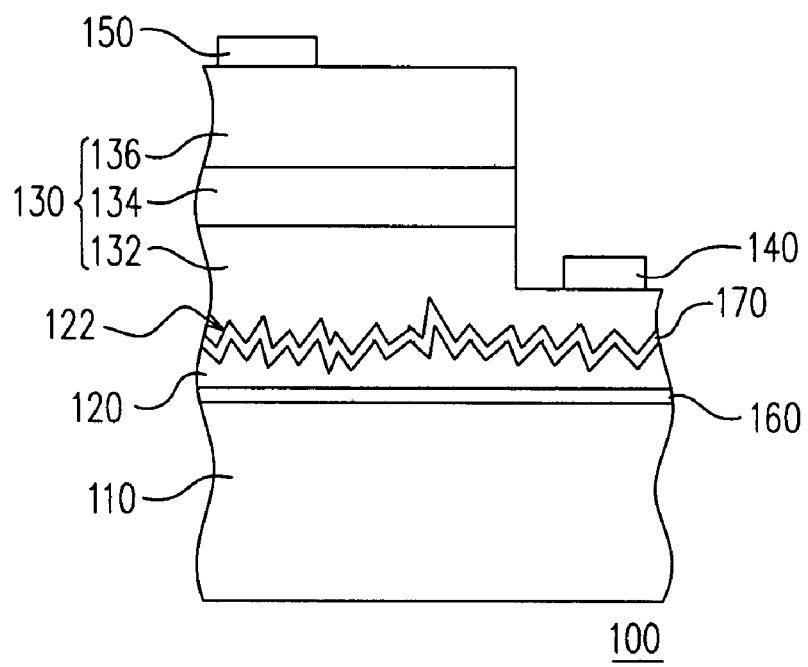
FIG. 6 is a schematic, cross-sectional view showing a light-emitting device having reaction layers according to a preferred embodiment of the present invention.

Further referring to FIG. 6, a first reaction layer 160 can be selectively disposed between the substrate 110 and the transparent adhesive layer 120, and a second reaction layer 170 can be selectively disposed between the transparent adhesive layer 120 and the first semiconductor layer 132, thereby increasing the adhesion of the transparent adhesive layer 120. The material of the first reaction layer 160 and the second reaction layer 170 can be SiNx, Ti or Cr.

Figure 7:
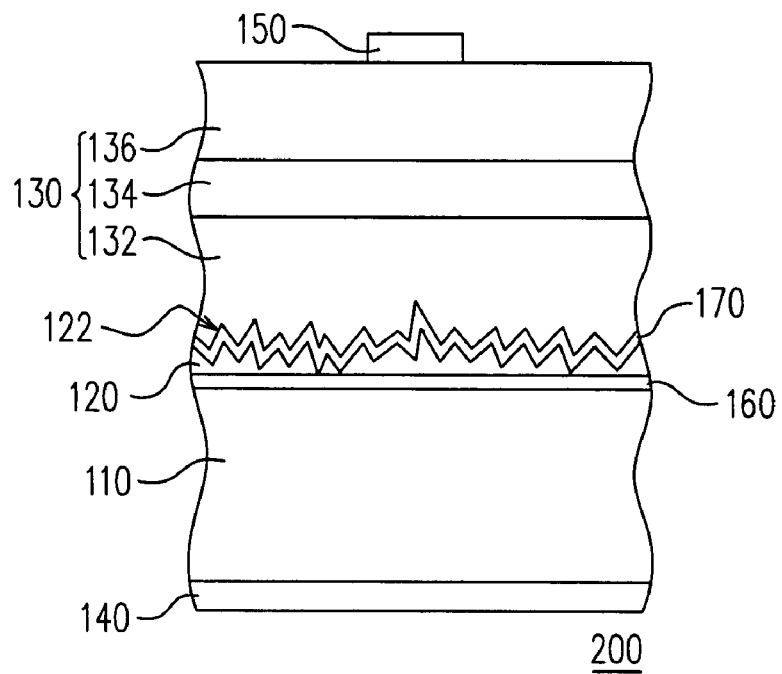
FIG. 7 is a schematic, cross-sectional view showing a light-emitting device according to another preferred embodiment of the present invention.

FIG. 7 is a schematic cross-sectional view showing a vertical-type light-emitting device 200 according to another preferred embodiment of the present invention. The substrate 110 is a conductive substrate. The first semiconductor layer 132 with the second reaction layer 170 underneath is coupled to a gel-state transparent adhesive layer 120, and the protrusion part of the second reaction layer 170 penetrates through the transparent adhesive layer 120 and ohmically contacts with the first reaction layer 160 in the case of the first reaction layer 160 and the second reaction layer 170 both being conductive. A first electrode 140 is formed on the lower surface of the substrate 110, and a second electrode 150 is formed on the upper surface of the second semiconductor layer 136. Similarly, a transparent conductive layer (not shown) can be selectively disposed between the second electrode 150 and the second semiconductor layer 136. The material of the transparent conductive layer comprises indium tin oxide, cadmium tin oxide, antimony tin oxide, zinc aluminium oxide or zinc tin oxide.

Figure 8:
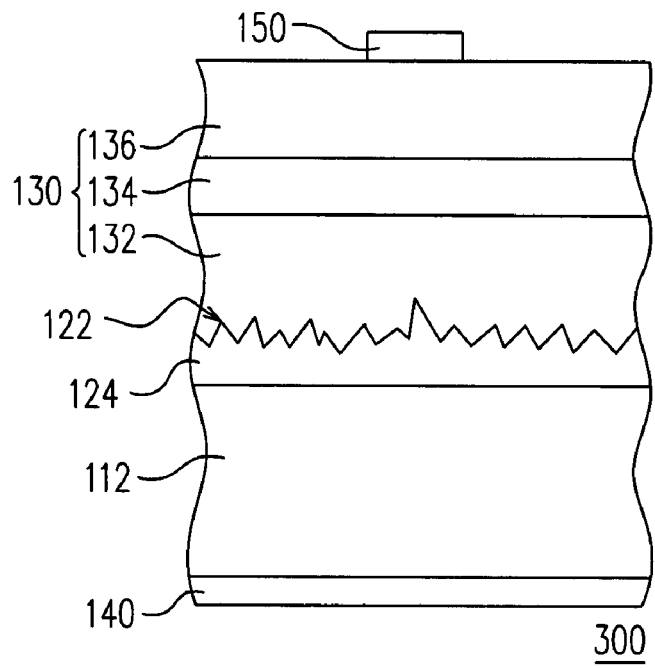
FIG. 8 is a schematic, cross-sectional view showing a light-emitting device according to another preferred embodiment of the present invention.

FIG. 8 is a schematic cross-sectional view showing a light-emitting device according to another preferred embodiment of the present invention. Referring to FIG. 8, the structure of the light-emitting device 300 is similar to that of the light-emitting device 100 shown in FIG. 3. The difference between them is that a transparent conductive adhesive layer 124 replaces the transparent adhesive layer 120, and the substrate 110 is replaced by a transparent conductive substrate 112, such that the light-emitting device 300 is electrically conductive vertically. The transparent conductive adhesive layer 124 is composed of intrinsically conductive polymer or polymer having conductive material distributed therein. The conductive material comprises indium tin oxide, cadmium tin oxide, antimony tin oxide, zinc oxide, zinc tin oxide, Au or Ni/Au. The first electrode 140 is formed under the transparent conductive substrate 112, and the second electrode 150 is formed on the second semiconductor layer 136.

In one embodiment of the present invention, the light-emitting device 300 further comprises a transparent conductive layer (not shown) disposed between the second electrode 150 and the second semiconductor layer 136. The material of the transparent conductive layer comprises indium tin oxide, cadmium tin oxide, antimony tin oxide, zinc aluminium oxide or zinc tin oxide.

Figure 9:
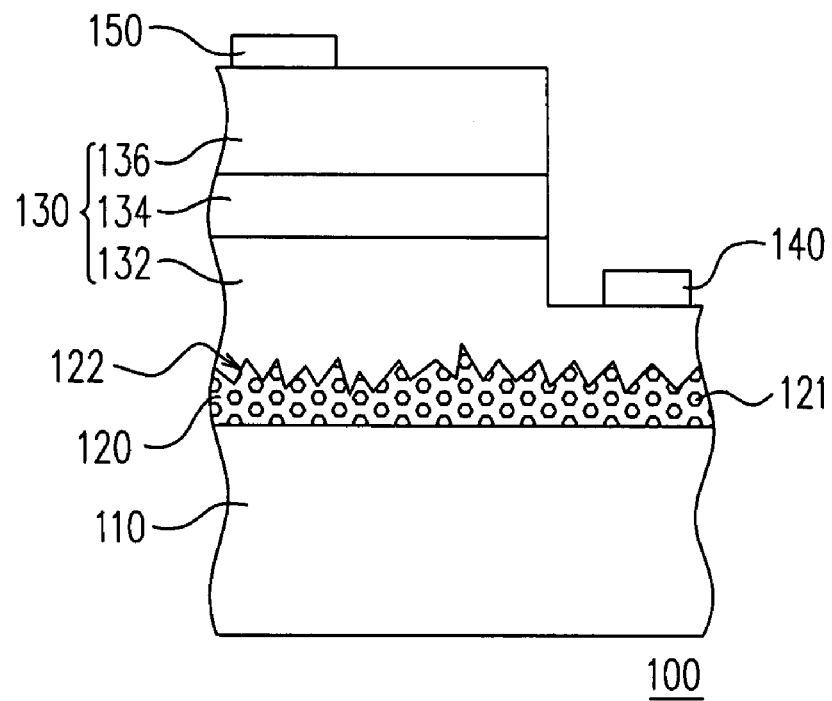
FIG. 9 is a schematic, cross-sectional view showing a light-emitting device having an adhesive layer embedded with wavelength-converting materials according to another preferred embodiment of the present invention.

FIG. 9 is a schematic cross-sectional view showing a light-emitting device having an adhesive layer embedding with wavelength-converting materials. The structure of the light-emitting device 100 is similar to that of the light-emitting device shown in FIG. 3. The difference between them is that the wavelength-converting materials 121 are embedded within the adhesive layer 120. Light emitted from the light-emitting layer 134, having a first peak wavelength, is partially absorbed by the wavelength converting materials 121, and then converted into light having a second peak wavelength.

Therefore, the original light is mixed with the converted light into composite light associated with a predetermined color having a broadband spectral spreading across the original and the converted light. The wavelength-converting materials comprise at least one selected from the group consisting of blue phosphor, yellow phosphor, green phosphor, and red phosphor. For example, it is easy to generate white light by using an LED having a GaN based light-emitting stack that emits blue light and a yellow phosphor, which is embedded within the transparent adhesive layer, capable of absorbing blue light and down-converting the blue light into yellow light. The blue light not absorbed by the yellow phosphor is mixed with the converted yellow light into white light. The material of the yellow phosphor can be YAG, TAG, or Silicate based materials. The term "blue phosphor" means the phosphor capable of converting the incident light entering the phosphor into blue light; similarly, it is analogous to "yellow phosphor", "green phosphor", and "red phosphor". The chemical compositions of each of the above-mentioned phosphors, which are well known to those skilled in the art, are not the major purpose of this invention and would not particularly describe herein.

Figure 10:
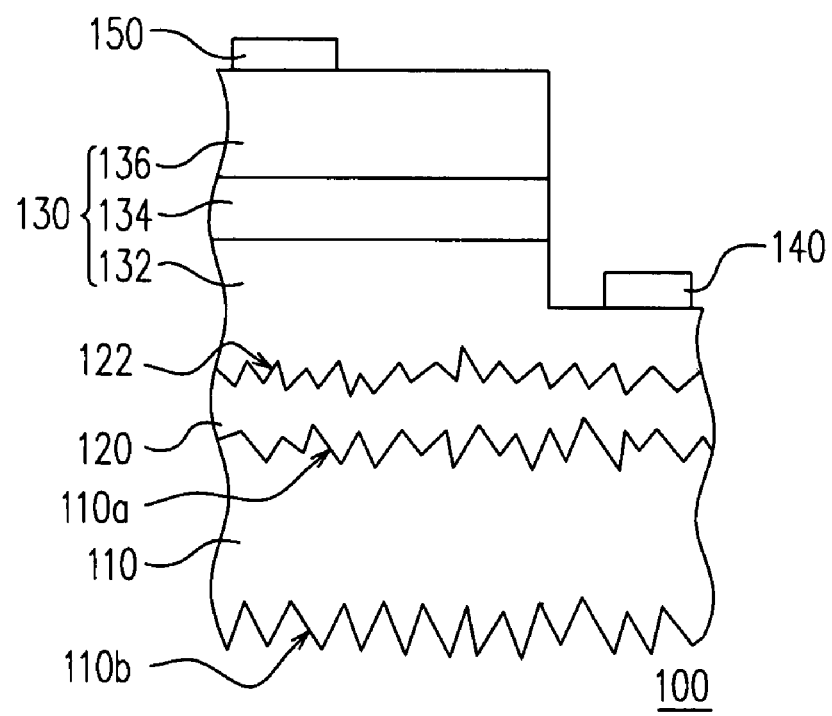
FIG. 10 is a schematic, cross-sectional view showing a light-emitting device having a substrate with at least one diffusing surface according to another preferred embodiment of the present invention.
Figure 11:
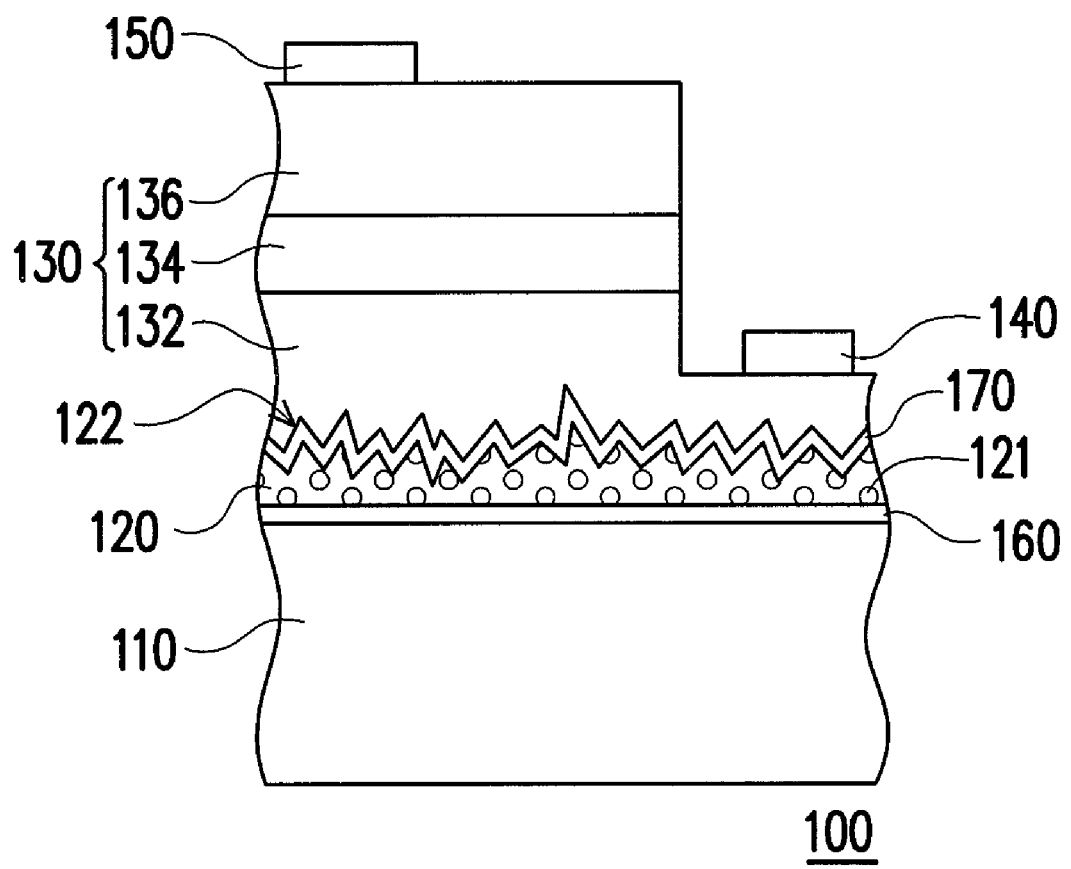
FIG. 11 is a schematic, cross-sectional view showing a light-emitting device having reaction layers and a transparent adhesive layer embedded with wavelength-converting materials according to another preferred embodiment of the present invention.

Although the various characteristics of the invention are already shown throughout FIG. 3 to FIG. 10 in accordance with the corresponding descriptions separately, any combinations of the various characteristics for further improving the performance of the light-emitting device are still under the scope of the invention. For instance, it is still under the scope of the present invention to embed wavelength-converting materials within the adhesive layer 120 of the light-emitting device 100 as shown in FIG. 10. Moreover, referring to FIG. 11, it is yet still under the scope of the present invention to embed wavelength-converting materials 121 within the adhesive layer 120 of the light-emitting device 100 as shown in FIG. 6. Furthermore, the light-emitting device proposed in the various embodiments of the invention and the combinations thereof are applicable, but not limited to the package form of wire bonding, flip-chip bonding, or directly mounting to a submout or PCB (Printed Circuit Board). It is also preferred that the light-emitting device proposed in the various embodiments of the invention and the combinations thereof are applicable, but not limited to a illumination apparatus, or a display with a white or hybrid light source.

Also, it will be apparent to those skilled in the art that various modifications and variations can be made to the structures in accordance with the present invention without departing from the scope or spirit of the invention. In view of the foregoing, it is intended that the present invention cover modifications and variations of this invention provided they fall within the scope of the following claims and their equivalents.

What is claimed is:

1. A light-emitting device (LED), comprising:
   a transparent substrate;
   a transparent adhesive structure embedding with wavelength-converting materials on the transparent substrate; and
   a light-emitting stack comprising:
   a first semiconductor layer having a first diffusing surface and directly formed on the transparent adhesive structure.

2. The LED according to claim 1, wherein the wavelength-converting materials comprise at least one selected from the group consisting of blue phosphor, yellow phosphor, green phosphor, and red phosphor.

3. The LED according to claim 1, wherein the light-emitting stack comprises III-nitride based materials.

4. The LED according to claim 3, wherein the wavelength-converting materials comprise yellow phosphor.

5. The LED according to claim 1, wherein the transparent substrate comprises a material selected from the group consisting of GaP, SiC, $Al_2O_3$, and glass.

6. The LED according to claim 1, wherein the transparent adhesive structure comprises a material selected from the group consisting of polyimide, benzocyclobutene (BCB), prefluorocyclobutane (PFCB), and indium tin oxide.

7. The LED according to claim 1, wherein the first diffusing surface comprises a rough surface.

8. The LED according to claim 1, wherein the first diffusing surface comprises a plurality of micro-protrusions.

9. The LED according to claim 8, wherein the micro-protrusions have a shape selected from the group consisting of semi-sphere, pyramid, pyramid polygon, and the combinations thereof.

10. The light-emitting device according to claim 1, wherein the light-emitting stack further comprises:
    a light-emitting layer on a portion of the first semiconductor layer;
    a second semiconductor layer on the light-emitting layer;
    a first electrode disposed on another portion of the first semiconductor; and
    a second electrode formed on the second semiconductor layer.

11. The light-emitting device according to claim 10, wherein the second semiconductor layer comprises a second diffusing surface.

12. The LED according to claim 11, wherein the transparent substrate comprises a third diffusing surface.

13. The LED according to claim 10, further comprising a first transparent conductive layer between the first electrode and the first semiconductor layer.

14. The LED according to claim 13, further comprising a second transparent conductive layer between the second electrode and the second semiconductor layer.

15. The LED according to claim 14, wherein the first transparent conductive layer and the second transparent conductive layer comprise a material selected from the group consisting of indium tin oxide, cadmium tin oxide, antimony tin oxide, zinc aluminium oxide, and zinc tin oxide.

16. The LED according to claim 1, wherein the transparent adhesive structure comprises:
    a first reaction layer for increasing the adhesion of the transparent adhesive layer;
    a second reaction layer for increasing the adhesion of the transparent adhesive layer; and
    a transparent adhesive layer, wherein the first reaction layer is formed between the transparent substrate and the transparent adhesive layer, the second reaction layer is formed between the transparent adhesive layer and the first semiconductor layer, and the wavelength-converting materials are embedded in the transparent adhesive layer.

17. The LED according to claim 16, wherein the first reaction layer and the second reaction layer comprise a material selected from the group consisting of $SiN_x$, Ti, and Cr.

18. The LED according to claim 1, wherein the light-emitting stack further comprises:
    a light-emitting layer on the first semiconductor layer; and
    a second semiconductor layer on the light-emitting layer.

19. The LED according to claim 18, wherein the transparent substrate is conductive.

20. The LED according to claim 19, wherein the transparent adhesive structure is a conductive adhesive layer and comprises a material selected from the group consisting of intrinsically conductive polymer and polymer having conductive material distributed therein.

21. The LED according to claim 20, wherein the polymer having conductive material distributed therein is selected from the group consisting of polyimide, benzocyclobutene (BCB), and prefluorocyclobutane (PFCB).

22. The LED according to claim 21, wherein the conductive material comprises a material selected from the group consisting of indium tin oxide, cadmium tin oxide, antimony tine oxide, zinc oxide, zinc tin oxide, Au, and Ni/Au.

23. The LED according to claim 18, further comprising a first electrode and a second electrode, wherein the first electrode is on the second semiconductor layer, and the second electrode is under the transparent substrate.

24. The LED according to claim 23, further comprising a transparent conductive layer between the second semiconductor layer and the first electrode.

25. The LED according to claim 24, wherein the transparent conductive layer comprises a material selected from the group consisting of indium tin oxide, cadmium tin oxide, antimony tin oxide, zinc aluminium oxide, and zinc tin oxide.

26. A display having at least a white or hybrid light source characterized in that the white or hybrid light source comprises at least one light-emitting diode having a transparent substrate, a light-emitting stack, and a phosphor-contained adhesive structure formed on the transparent substrate, wherein the light-emitting stack comprises a first semiconductor layer having a first diffusing surface and directly formed on the phosphor-contained adhesive structure.

* * * * *